May 9, 1967 P. TELL 3,318,758

METHOD OF MAKING A PRINTED CIRCUIT BOARD WHICH INCLUDES LOW TEMPERATURE SATURATION AND THE PRODUCT

Filed Feb. 18, 1963

PHILIP TELL
INVENTOR.

BY Rudolph J. Juick
ATTORNEY 3,318,758

METHOD OF MAKING A PRINTED CIRCUIT BOARD WHICH INCLUDES LOW TEMPERATURE SATURATION AND THE PRODUCT

Philip Tell, Summit, N.J., assignor to Tellite Corporation, Orange, N.J., a corporation of Delaware
Filed Feb. 18, 1963, Ser. No. 259,790
10 Claims. (Cl. 161—216)

This application is a continuation-in-part of my application, Serial No. 80,887, filed Jan. 5, 1961, and abandoned.

This invention relates broadly to metal-plastic laminates and more specifically to a laminate having improved physical and electrical characteristics and particularly adapted for use in micro-wave printed circuitry.

Broadly, the term printed circuit board has been applied to metal-clad sheets of insulation material, such as copper sheet or foil bonded to the surface of a plastic sheet. Portions of the overlying copper foil are removed, by known processes, such that the remaining copper forms an electrical circuit of desired configuration or design. One of the main advantages of a printed circuit lies in the elimination of individual lead wires which require a separate soldering operation to the various individual components included in the particular circuit. In general, the configuration of a printed circuit is designed to facilitate the positioning of conventional circuit components, such as resistors, capacitors, etc., and the soldering thereof to the wiring by a dipping operation. Inasmuch as the printed circuit, in this case, really constitutes a substitute for the conventional circuit wiring,, it is more accurate to refer to the metal-plastic laminate as a printed wiring board. Such printed wiring boards are useful in apparatus designed for operation in the audio and radio frequency ranges, wherein the dimensional stability and electrical characteristics of the laminate are not of a critical character.

However, in the micro-wave field, the pattern etched on the metal-clad laminate forms not only the electrical wiring but also actual electrical components, such as inductors, capacitors, matching transformers, filters, etc. In such case, the metal-plastic laminate more properly is called a printed circuit board. By reason of the high frequencies involved, conventional metal-plastic laminates are not satisfactory for use in micro-wave circuits.

In micro-wave design work, the basic circuit parameters are determined first by the thickness of the laminate and then by its dielectric constant. These factors are of a critical character and must be considered in appropriate formulae so that the completed circuit design will yield the desired operating results. Thus, circuit stability and functioning depend upon the dimensional stability, dielectric constant and water absorption constant of the laminate.

Numerous attempts have been made to provide a printed circuit board suitable for micro-wave use. For example, a copper coating or foil has been applied to a substrate of glass-loaded, di-vinyl benzol styrene. Unfortunately, such material is not isotropic so that the dielectric constant measured in the plane of the material differs from that measured perpendicular to the plane of the material. Consequently, a considerable amount of empirical work must be done after the particular circuit has been designed but before the circuit can be approved for actual use. This material also possesses a water absorption factor which is objectionable.

Various other plastic-glass mixtures have also been proposed for use in the field of micro-wave printed circuitry. However, printed circuit boards made of these materials cannot be closely controlled, resulting in small, but objectionably significant, variations in physical and electrical properties from one small section of the laminate to another. These variations are of such nature that in many circuits it is impossible to compensate for them empirically.

In addition to the above-stated requirements, a micro-wave printed circuit board must have a high peel strength, that is, the copper foil should be bonded to the plastic substrate such that a force of at least five (5) pounds is required to separate a one-inch wide strip of the foil from the substrate. Still further, the printed circuit board, regardless of its area should have a minimum thickness variation.

Certain thermo-plastic materials possess characteristics which are highly desirable for printed circuits designed for operation at very high frequencies. In particular, such materials have a low loss tangent, a very low moisture absorption factor and are isotropic, that is, the dielectric constant is uniform in all directions. The polymers of aliphatic olefins which are suitable for use as substrates in the process of this invention are the crystalline, high density, solid resins having a molecular weight generally in excess of 10,000. These resins are manufactured by low pressure catalytic polymerization processes, including some of the modified high pressure processes which produce a high density product, and particularly by the processes known in the trade as the Ziegler process, the Phillips process, and the Standard of Indiana Process, or industrial modifications thereof, as described in the book, "Polyolefin Resin Processes," by Marshall Sittig, Gulf Publishing Co., Houston, Tex. (1960).

These high density products usually melt at temperatures above 100° C. and show by X-ray diffraction analysis the presence of a crystalline phase. The polymer structure has limited branching and limited cross-linking of the polymer chains. These polymers are commonly referred to as "low pressure" or "linear" polymers. Although linearity is a sufficient criterion in polyethylene polymers, the more complex molecules such as polypropylene or poly-1-butene, introduce the more complex questions of the arrangement of the molecules in space. For these polymers, the "isotactic," or regularly ordered, arrangements are preferred to the "actactic," or disordered, polymers.

The solid, crystalline resins which are especially useful for this invention are made from 1-olefins and include polyethylene polymers having a density of from 0.935 to 0.980, and preferably above 0.95 gram per cubic centimeter, a molecular weight in excess of 10,000 and a melting point of 100° to 150° C.; atactic polypropylene polymers having a density of about 0.90 to 0.92 gram per cubic centimeter; atactic poly-1-butene polymers having a density of 0.90 to 0.91 gram per cubic centimeter, as well as copolymers of ethylene and propylene having a density of from about .903 to .907 gram per cubic centimeter.

Copolymerization of 1-olefins with other olefins affords a valuable means of varying and improving the properties of homopolymers beyond a point which can be economically achieved by the conditions of homopolymerization. These solid, high density polymer resins are made by the copolymerization of ethylene with propylene, ethylene with 1-butene, and propylene with 1-butene, as well as by the copolymerization of ethylene with varying amounts of other olefins such as 1-pentene, 1-hexene, 1-dodecene, 1-hexadecene or norbornene. Blends of high density solid resins are also useful.

On the other hand, pure copper is known to be the best for use in electrical circuits. Therefore, a laminate, or printed circuit board formed of a pure copper foil firmly bonded to a substrate of one of the thermo-plastic materials above mentioned would provide an ideal board for micro-wave printed circuits. Numerous attempts have been made by experts in this field to produce such a laminate, but to date these efforts have not been successful. This is due to various reasons such as the relatively low softening temperature of the material, the difficulty of bonding a copper foil to the material without the use of cement, the inability to produce a sheet of the material for reasonable area, having a precise uniform thickness by means of a molding operation. I have overcome these obstacles by a method of producing a laminate which is described in detail hereinbelow.

A printed circuit board made in accordance with this invention possesses physical and electrical characteristics which meet the requirements of micro-wave circuitry, namely, stability of shape and dimensions, low loss tangent, low isotropic dielectric constant, nil water absorption, high peel strength and chemical inertness. These characteristics make it possible to design circuits which are completely compatible with current design information, thereby eliminating, or reducing to a minimum, the amount of empirical work to be done to produce a circuit approved for actual use. The laminate is ideally suited for use in stripline techniques for the production of directional couplers, transmission lines, etc. Still further, the laminate is light in weight, can readily be machined and cold punched, and can be shaped permanently to a desired surface contour.

An object of this invention is the provision of a printed circuit board for use particularly in micro-wave printed circuitry.

An object of this invention is the provision of a printed circuit board comprising a thin sheet of copper firmly bonded to a substrate of a thermo-plastic material, such as a linear polyolefin, without the use of cement.

An object of this invention is the provision of a microwave printed circuit board having a uniform thickness and a high peel strength.

An object of this invention is the provision of a method for bonding a sheet of copper to the surface of a substrate as above defined, which method includes treatment of the substrate to render the latter strain free and dimensionally stable.

An object of this invention is the provision of a method for producing a printed circuit board for use in microwave circuitry, which method comprises first bonding a sheet of electrical conductive material to a film of substrate as above defined and then bonding the resulting clad sheet to a relatively heavy substrate of similar material which has been irradiated.

These and other objects and advantages will become apparent from the following description when taken in conjunction with the accompanying drawings which illustrate a preferred form of the invention. It will be understood, however, that the drawings are for purposes of illustration and do not define the scope or limits of the invention, reference being had for the latter purpose to the claims appended hereto.

In the drawings wherein like reference characters denote like parts in the several views.

Figure 1:
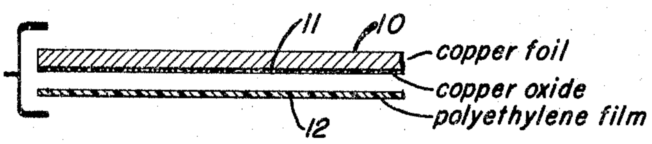
FIGURE 1 is a view, drawn in cross-section and to an exaggerated scale, showing the metal foil and one example of a thin plastic film prior to the first bonding operation.

Referring now to FIGURE 1, the metal foil preferably comprises a sheet of substantially pure copper 10 either rolled from an ingot or produced electrolytically.

Although copper is preferred as the electrical conductive sheets, yet I do not wish to be limited to this material as high copper alloys, such as those containing 85% or more of copper, are suitable. My method will also work with electrical conductive coatings in which copper is plated on other materials, examples being nickel, steel and titanium. I also contemplate employing material such as aluminum and silver which are good conductors and which may be bonded to the substrate by suitably varying the process.

The conductive sheet can be of any thickness although a thickness of approximately .0026″ is of general use in micro-wave circuitry. One side of the copper sheet, if such is used, is treated, desirably by chemical or electrolytic means, to produce a continuous coating 11 of copper oxide, a preferred example being cupric oxide crystals. A thin film 12 of substrate such as before defined, a preferred example being linear polyethylene plastic, may be first bonded to the oxide coating. The plastic film desirably has an initial thickness of about .002 inch, although this dimension may vary from .001 to .005 inch. The oxide-coated copper sheet and the plastic film are placed between flat platens and subjected simultaneously to heat in the range of 375–550° F. and a pressure of 50–200 pounds per square inch for a period of time, about five minutes, sufficient to establish a permanent bond between the oxide and the polar groups of the plastic through the partial reduction of the oxide. This results in a thin laminate or sandwich, as shown in FIGURE 2 and identified by the numeral 13.

Figure 2:
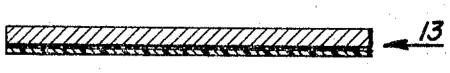
FIGURE 2 is a similar view of the metal and plastic bonded together.

It is here pointed out that in producing the laminate, shown in FIGURE 2, the platens are not confined, as is the case in a mold, whereby the application of the stated heat and pressure results in a softening of the plastic film attended by a reduction in the film thickness. The excess material is free to flow outwardly of the platens, the area of the platens being slightly greater than that of the copper sheet. In this step of the process, there is no attempt made to control precisely the thickness of the laminate, the important considerations being to apply a plastic coating to the oxide layer and to retain a parallel orientation of the platens during the heat-pressure cycle. The laminate having the form, as shown in FIGURE 2, is removed from the press and allowed to cool substantially to room temperature.

Figure 4:
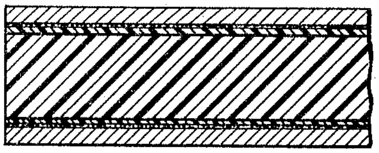
FIGURE 4 is a similar view of the completed printed circuit board.

In the second step of the process, two laminates 13 are bonded to opposite surfaces of a relatively thick substrate, as before defined, a preferred example being a linear polyethylene plate such as is identified by the numeral 14 in FIGURE 4. Commercially available sheets or plates of such material are subject to a thickness variation of many thousandths of an inch, which cannot be tolerated in micro-wave work. Consequently, I have found it necessary to first cut from stock material a plate of desired form and surface area, the stock material being selected to have a minimum thickness exceeding the maximum desired thickness of the final substrate. By suitable machine operations, such as milling and/or grinding, I produce a substrate having a desired, precisely uniform thickness throughout. In this manner, the substrate can be made to a given thickness with a maximum thickness variation not exceeding ±.001 inch. It also is preferable that the relatively thick substrate include a suitable anti oxidant thereby to preserve the electrical and physical properties of the finished circuit board for many years throughout normal operating ranges of temperature in free atmosphere.

The substrate of precise thickness is then irradiated as, for example, by exposure to bombardment by high energy electrons, the required dosage depending upon the substrate thickness. For example, a 10 megarad dosage is sufficient for a substrate having a thickness of ⅛-inch. The purpose of irradiating the substrate is to alter, by molecular cross-linking, the physical properties of the material, specifically its resistance to heat, which, in the commercial state of the material, is too low for commercial, circuit soldering techniques. A calculated dosage of high energy radiation, produced either by isotope sources or machine electron accelerators, results in a release of energy in the molecular chain, producing free radicals that, in turn, react to produce new molecules. This modification of the substrate material properties produces a substrate which exhibits thermosetting properties, that is, it does not melt at elevated temperatures. Thus the substrate can be subjected to a temperature of 600° F. as required for soldering, either manual, or by machine roller coating.

Figure 3:
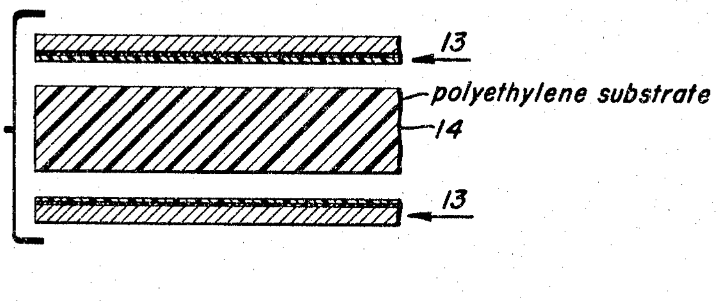
FIGURE 3 is a similar view showing the bonded thin copper-plastic sheets and the relatively heavy plastic plate forming one example of the substrate, prior to the second bonding operation.

A lay-up, see FIGURE 3, of the substrate 14 and two laminates 13, is now placed between parallel platens and subjected simultaneously to heat and pressure. In this case, the temperature falls in the range of 350–425° F., and the pressure in the range of 25–200 pounds per square inch. Such heat-pressure cycle is maintained for a relatively short period of time, for example, 45 seconds when the substrate has a thickness of ⅛-inch. In the case of thicker substrates, the time may advantageously be increased. The important consideration in this step of the process is the application of sufficient heat to just soften the contacting plastic surfaces to effect a cross linking thereof without, at the same time, softening the entire substrate. For the purpose of better control, it is preferable to apply a relatively lower temperature over a longer period of time to effect the softening of the substrate surfaces. However, reasonable care or the use of automatic timing mechanisms will result in increased production as higher temperatures and shorter time periods may be employed.

Inasmuch as the second step in the process is performed by use of unconfined, parallel platens, together with a heat-pressure cycle which results in a softening only of the outer surfaces of the substrate, the initial precise thickness of the substrate is preserved. Consequently, the completed printed circuit board, as shown in FIGURE 4, has a dimensional stability and uniformity which cannot be achieved by conventional methods. It will be apparent that a printed circuit board of desired size and shape can be cut from relatively large boards made as described herein. Each and every circuit board made in this manner will be of a uniform thickness with a maximum thicknes variation of ±.001 inch.

As an alternative to the employment of a thin film of substrate, such as before defined, which is first bonded to the oxide coatings of thin sheets of electrical conductive material, I may, if desired, oxidize one side of each of two thin sheets of electrical conductive material such as copper, and bond such sheets directly to the opposite surfaces of a board of substrate of material such as previously described. That is, for example, the oxide-coated thin copper sheets may be directly bonded to opposite surfaces of a relatively thick substrate, as before defined, in a manner similar to that previously described for bonding the plastic-coated copper sheets to opposite sides of a substrate. This involves omitting one of the steps of the process, that is, the step of bonding the electrical conductive sheets to the thin films or sheets of plastic material, which are then sandwiched between the conductive sheets and the substrate.

One serious deficiency in micro-wave printed circuit boards made in accordance with prior processes lies in the deformation of the board upon removal of a substantially greater copper area from one side than the other. For example, in the case of a substrate having copper sheets bonded to opposite surfaces, a removal of the copper sheet from one surface results in actual curling of the board into arcuate shape. A partial, but unequal, removal of copper from the opposite surfaces of the substrate results in a warping of the board. Such deformation, or warping, of the board militates against its use in micro-wave printed circuitry.

I remove the possibility of such deformation or warping of the metal-clad board by subjecting the completed laminate to a normalizing treatment, thereby to relieve internal stresses. This treatment consists in subjecting the board to a relatively low temperature in the range of −70° to −320° F. I have found that subjecting the board to a temperature of −320° until temperature saturation is reached, a single such treatment stabilizes the board so that even upon subsequent removal of the entire copper coating from one surface thereof, there results no deformation of the board. On the other hand, subjecting the board to a temperature of −70° F. requires either a prolonged exposure or, preferably, several cycles of treatment to achieve the same result, that is, the board is subjected alternately to −70° F. and room temperature for time periods sufficient to permit temperature saturation at each temperature value.

A composite laminate, made in accordance with this invention, has a precise uniform thickness (variation of ±.001″), a nil water absorption factor, a low dielectric constant (2.35) in all directions, a high peel strength (10 pounds minimum) and a low loss tangent (.0002). The laminate has an exceptionally high dimensional stability thereby imposing no restrictions on the amount of the copper to be removed from one or both surfaces. Also, inasmuch as the boards can be made to very close thickness tolerances, complete reproducibility and interchangeability of precision printed circuits can be achieved with production of techniques. Still further, the specific gravity of the substrate is low, approximately .95, which is an important consideration in printed circuits to be used in airborne equipment or in rotating, ground support equipment.

I have described my invention with specific reference to a printed circuit board comprising copper sheets bonded to a substrate, thereby to provide a board of outstanding characteristics particularly useful in micro-wave printed circuitry. It will be apparent, however, that the components of the circuit board and the steps in the process of producing same may be varied to produce boards for applications of a less critical nature. The two-step bonding process, wherein the copper sheet is first bonded to a very thin sheet of the plastic material and the subsequent bonding of such copper-plastic sandwich to a relatively thick substrate of the same or compatible material, together with the fact that the bonding operations do not involve closed molds, permits the use of any of the specified materials for the substrate. The normalizing of the metal clad laminate by subjecting it to a low temperature may be omitted when the board is to be used in applications which do not require a high degree of dimensional stability.

Having now described my invention, those skilled in this art will be able to make changes and modifications to produce printed circuit boards to meet specific requirements. Such changes and modifications may be made without departing from the scope and spirit of the invention as set forth in the following claims.

I claim:

1. The method of making a printed circuit board, which method comprises irradiating a polyethylene substrate by bombardment with high energy electrons; forming a cupric oxide coating on one surface of each of two thin sheets of copper; bonding the sheets to opposite surfaces of the substrate under the action of heat and pressure, with the oxide coatings of the sheets in contact with the substrate surfaces; and subjecting the resulting laminate to temperature saturation at approximately −320° F.

2. The method of making a printed circuit board, which method comprises forming a cupric oxide coating on one surface of two thin copper sheets; bonding a thin film of polyethylene to the oxide coating of each sheet under the action of heat and pressure; placing a polyethylene substrate between a pair of platens with opposed surfaces of the substrate in contact with the thin film that is bonded to the oxide coatings of the copper sheets; applying pressure to the platens while heating the assembly thereby to bond the copper sheets to the substrate; and subjecting the resulting laminate to temperature saturation at approximately —320° F.

3. The method of making a printed circuit board, which method comprises irradiating a substrate which is a crystalline, high density, high molecular weight, solid polymer or copolymer of one or more aliphatic olefins by bombardment with high energy electrons; forming a cupric oxide coating on the copper surface of each of two thin sheets which are copper, an alloy containing a major proportion of copper, or copper plated on another metal; bonding said sheets to opposite surfaces of said substrate under the action of heat and pressure, the oxide coatings of the sheets being in contact with the substrate; and subjecting the resulting laminate to temperature saturation in the range of —70° F. to —320° F.

4. The method of making a printed circuit board, which method comprises forming a cupric oxide coating on the copper surface of each of two thin sheets which are copper, an alloy containing a major proportion of copper, or copper plated on another metal; bonding a thin film of a material which is a crystalline, high density, high molecular weight, solid polymer or copolymer of one or more aliphatic olefins under the action of heat and pressure to each of said sheets, the oxide coating of each sheet being in contact with the film; placing a substrate which is a crystalline, high density, high molecular weight, solid polymer or copolymer of one or more aliphatic olefins between a pair of platens with opposed surfaces of the substrate adjacent to the thin film that is bonded to the sheets; applying pressure to the platens while heating the assembly thereby to bond the sheets to the substrate; and subjecting the resulting laminate to temperature saturation in the range of —70° F. to —320° F.

5. The method of making a printed circuit board, which method comprises forming a cupric oxide coating on the copper surface of each of two thin sheets which are copper, an alloy containing a major proportion of copper, or copper plated on another metal; bonding the sheets to opposite surfaces of a substrate which is a crystalline, high density, high molecular weight, solid polymer or copolymer of one or more aliphatic olefins under the action of heat and pressure, the oxide coating of the sheets being in contact with the substrate; and subjecting the resulting laminate to temperature saturation in the range of —70° F. to —320° F.

6. The process of claim 5 wherein said substrate is a crystalline, solid, polymer or copolymer of one or more aliphatic olefins having a density above about 0.90 gram per cubic centimeter, and a molecular weight above 10,000.

7. The process of claim 5 wherein said substrate is a solid, crystalline polyethylene polymer having a density from about 0.935 to about 0.980 gram per cubic centimeter, a molecular weight in excess of 10,000, and a melting point above 100° C.

8. The process of claim 5 wherein said substrate is a crystalline, high density, high molecular weight, solid copolymer of ethylene and 1-butene.

9. The process of claim 5 wherein said temperature is below —70° F. but above —320° F. and treatment is completed by repeated exposure at the selected temperature.

10. The printed circuit board produced by the process of claim 5.

References Cited by the Examiner

UNITED STATES PATENTS

| | | | |
|---|---|---|---|
| 2,320,112 | 5/1943 | Wiley | 264—28 |
| 2,551,591 | 5/1951 | Foord | 161—225 |
| 2,642,626 | 6/1953 | Yurgen | 264—28 |
| 2,964,436 | 12/1960 | Mikulis et al. | 156—3 |

FOREIGN PATENTS

| | | |
|---|---|---|
| 207,613 | 8/1955 | Australia. |

EARL M. BERGERT, *Primary Examiner.*

DOUGLAS J. DRUMMOND, *Examiner.*